United States Patent
Cideciyan et al.

(10) Patent No.: US 8,854,237 B2
(45) Date of Patent: Oct. 7, 2014

(54) MODULATION ENCODING AND DECODING

(71) Applicant: International Business Machines Corporation, Armonk, NY (US)

(72) Inventors: Roy D. Cideciyan, Rueschlikon (CH); Thomas Mittelholzer, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/012,400

(22) Filed: Aug. 28, 2013

(65) Prior Publication Data

US 2014/0085114 A1    Mar. 27, 2014

(30) Foreign Application Priority Data

Sep. 24, 2012 (GB) .................................. 1216958.7

(51) Int. Cl.
*H03M 5/14*     (2006.01)
*G11B 20/14*    (2006.01)

(52) U.S. Cl.
CPC ........... *H03M 5/145* (2013.01); *G11B 20/1426* (2013.01)
USPC .................................. 341/59; 341/81; 360/40

(58) Field of Classification Search
CPC ..... H03M 5/14; H03M 5/145; G11B 20/1426
USPC ................................ 341/58, 59, 80, 81; 360/40
See application file for complete search history.

(56) References Cited

U.S. PATENT DOCUMENTS

| | | | |
|---|---|---|---|
| 6,130,629 A | 10/2000 | Aziz et al. | |
| 6,198,582 B1 * | 3/2001 | Tsang et al. | 360/40 |
| 6,229,458 B1 | 5/2001 | Altekar et al. | |
| 6,456,208 B1 | 9/2002 | Nazari et al. | |
| 6,933,865 B1 | 8/2005 | Kuznetsov et al. | |
| 7,142,134 B2 * | 11/2006 | Blaum et al. | 341/58 |
| 7,616,134 B1 | 11/2009 | Mittelholzer | |
| 7,719,444 B2 * | 5/2010 | Cideciyan | 341/59 |
| 2007/0182597 A1 * | 8/2007 | Hollmann et al. | 341/50 |
| 2009/0115647 A1 | 5/2009 | Mittelholzer | |

FOREIGN PATENT DOCUMENTS

KR    1020090012421 A    2/2009

OTHER PUBLICATIONS

Kees A. Schouhamer Immink, "Codes for Mass Data Storage Systems," Second Edition, Shannon Foundation Publishers, 2004, pp. 1-362.
GB Search Report, Intellectual Property Office, Application No. GB1216958.7; Patents Act 1977: Search Report Under Section 17(5), Date Mailed: Jan. 22, 2013, pp. 1-3.

* cited by examiner

*Primary Examiner* — Howard Williams
(74) *Attorney, Agent, or Firm* — Cantor Colburn LLP (57) ABSTRACT

A method for producing N-bit output words of RLL-encoded data having both a global constraint $G_o$ and an interleave constraint $I_o$ on bits of a first value includes receiving N-bit input words of RLL-encoded data having both a global constraint $G_i$ and an interleave constraint $I_i$ on bits of like value; and producing the output words from respective input words by sliding-window encoding of each input word to replace predetermined bit-sequences with respective substitute sequences such that $G_o < G_i$; wherein each substitute sequence is unique and violates a run-length limit associated with the interleave constraint $I_i$ such that $I_o > I_i$.

18 Claims, 5 Drawing Sheets

Left Boundary

| Input $x = x_0 x_1 \ldots x_{15}$ | Output $y = y_0 y_1 \ldots y_{15}$ |
|---|---|
| 0 0 0 0 $x_5$ 1 $x_7 x_8 x_9 \ldots x_{14} x_{15}$ | 0 $x_8$ 0 1 0 $x_5$ 0 $x_7$ 1 $x_9 \ldots x_{14} x_{15}$ |

Figure 6

Within Codeword

| Case | Input $x = x_0 x_1 \ldots x_{15}$ | Output $y = y_0 y_1 \ldots y_{15}$ |
|---|---|---|
| 1 | 0 0 0 0 0 0 0 0 0 0 0 $x_{11}$ 1 $x_{13} x_{14} x_{15}$ | 1 0 $x_{15}$ 0 $x_{11}$ 0 $x_{13}$ 0 0 0 0 0 1 0 $x_{14}$ 1 |
| 2 | 0 0 0 0 0 0 0 0 0 0 1 $x_{11} x_{12} x_{13} x_{14} x_{15}$ | 1 0 $x_{15}$ 0 $x_{11}$ 0 $x_{13}$ 0 0 0 1 0 $x_{12}$ 0 $x_{14}$ 1 |
| 3 | 0 0 0 0 0 0 0 0 0 1 $x_{10} x_{11} x_{12} x_{13} x_{14} x_{15}$ | 1 0 $x_{11}$ 0 $x_{13}$ 0 $x_{15}$ 0 1 0 $x_{10}$ 0 $x_{12}$ 0 $x_{14}$ 1 |

Figure 7

Right Boundary: Enforce $G=8$ on last 15 bits

| Case | Relations | Input $\mathbf{x} = x_0 x_1 \ldots x_{14}$ | Output $\mathbf{y} = y_0 y_1 \ldots y_{14}$ |
|---|---|---|---|
| 1.i | — | $x_0$ 0 0 0 0 0 0 0 0 0 0 $x_{11} x_{12} x_{13} x_{14}$ | $x_0$ 0 $x_{10} x_{11} x_{12} x_{13} x_{14}$ 1 1 0 1 0 0 0 1 0 |
| 1.ii | — | 1 1 0 0 0 0 0 0 0 0 0 0 0 1 1 | 1 1 0 0 0 0 1 1 0 1 0 0 0 1 0 |
| 2.i | $x_{10} = \sim x_0$ | $x_0$ 0 0 0 0 0 0 0 0 0 0 $x_{10} x_{11} x_{12} x_{13} x_{14}$ | $x_0$ 0 $x_{11} x_{12} x_{13} x_{14}$ 1 0 0 1 0 0 0 1 0 |
| 2.ii | $x_{12} = \sim x_2$ | $x_0 x_1 x_2$ 0 0 0 0 0 0 0 0 0 $x_{12}$ 1 $x_{14}$ | $x_0 x_1 x_2$ 0 1 $x_{14}$ 1 1 0 0 0 0 0 1 0 |
| 3.i | $x_{14} = 0$ | 0 0 0 0 0 0 0 0 0 1 $x_{10} x_{11} x_{12} x_{13}$ 0 | 0 1 $x_{10} x_{11} x_{12} x_{13}$ 1 0 0 1 0 0 0 1 0 |
|  | $x_{14} = 1$ | 0 0 0 0 0 0 0 0 0 1 $x_{10} x_{11} x_{12} x_{13}$ 1 | 0 $x_{10} x_{11} x_{12}$ 1 $x_{13}$ 1 0 0 0 0 0 0 1 0 |
| 3.ii | $(x_{11}, x_{13}) \neq (0, 0)$ | 1 0 0 0 0 0 0 0 0 0 1 $x_{11} x_{12} x_{13} x_{14}$ | 1 0 $x_{11} x_{12} x_{13} x_{14}$ 1 0 0 0 0 1 0 1 0 |
| 3.iii | $(x_{12}, x_{14}) \neq (0, 0)$ | $x_0$ 1 0 0 0 0 0 0 0 0 1 $x_{12} x_{13} x_{14}$ | $x_0$ 1 $x_{12} x_{13} x_{14}$ 1 0 0 0 1 0 1 0 |
| 3.iv | $x_{12} = \sim x_3$ | $x_0 x_1 x_2 x_3$ 0 0 0 0 0 0 0 0 0 $x_{12}$ 1 $x_{14}$ | $x_0 x_1 x_2 x_3$ 0 $x_{14}$ 1 0 0 0 0 0 0 1 0 |

Figure 8A

Right Boundary: Enforce $G_{right} = 4$ on last 15 bits

| Relations | Input $\mathbf{x} = x_0 x_1 \ldots x_8$ | Output $\mathbf{y} = y_0 y_1 \ldots y_8$ |
|---|---|---|
| $(x_1, x_3) \neq (0,0)$ | $x_0 x_1 1 x_3 0 0 0 0 0$ | $1 x_1 0 x_3 0 1 0 x_0 0$ |

Figure 8 B

| Input $\mathbf{x} = x_0 x_1 \ldots x_{10}$ | Output $\mathbf{y} = y_0 y_1 \ldots y_{10}$ |
|---|---|
| $0 0 0 0 0 x_6 x_7 x_8 x_9 x_{10}$ | $0 x_{10} 0 x_6 0 x_8 0 x_7 0 x_9 1$ |
| $0 0 0 0 0 0 0 0 0 0 1$ | |

Figure 9

in channel input sequences (i.e., after partial-response precoding of the (G, I, M)-encoded bit-stream) to floor(M/2)+1, where T denotes the symbol duration and floor(s) denotes the largest integer not exceeding s. In recording systems such as tape drives in which a phase-locked loop acquires phase lock based on a long alternating 2T VFO pattern, the VFO constraint ensures that there is no modulation encoded sequence which can be mistaken for a long VFO pattern.

MODULATION ENCODING AND DECODING

PRIORITY

This application claims priority to Great Britain Patent Application No. 1216958.7, filed Sep. 24, 2012, and all the benefits accruing therefrom under 35 U.S.C. §119, the contents of which in its entirety are herein incorporated by reference.

BACKGROUND

This invention relates generally to modulation encoding and provides methods and apparatus for producing encoded data with both global and interleave run-length constraints. Corresponding decoding systems are also provided.

Modulation codes are employed in data storage systems to eliminate undesirable bit-sequences in the recording data, for example bit-sequences which give rise to errors in the reproduction process. Modulation codes impose some form of constraint on the occurrence of such bit-sequences in the encoded bit-stream. One example of an undesirable bit-sequence is a long run of bits of the same value. Another example is a long run of bits of the same value in alternating positions in the bit stream, i.e., in either the odd (O) or even (E) interleave of a bit stream . . . EOEOEO . . . For instance, a long sequence of the form 0a0b0c0d0 . . . , where a, b, c, etc. can be either "0" or "1", would be generally undesirable. Run-length-limited (RLL) codes can be used in modulation encoders to restrict the length of such bit-runs. RLL-codes can be constructed to impose both a global constraint G and an interleave constraint I on the RLL-encoded data. The global constraint G specifies the maximum possible run-length of bits of a particular value in the encoded bit-stream. The interleave constraint I specifies the maximum possible run-length of bits of a particular value in each of the odd and even interleaves of the encoded bit-stream. The RLL encoder receives a succession of K-bit data words and encodes each data word into an N-bit codeword satisfying the G and I constraints. These constraints require a number of run-length limits to be satisfied in individual codewords. The global and interleave run-length limits G and I of course apply within each codeword. In addition, to ensure that the constraints are also met when codewords are concatenated in the output bit-stream, tighter run-length limits are imposed at codeword boundaries. That is, global and interleave run-length limits lower than G and I are imposed on bit-runs at the left and right boundaries of a codeword so that, when any two codewords are concatenated, the overall G and I constraints cannot be exceeded across the boundary.

The global and interleave constraints in the RLL codes described above typically apply to bits of like value. The (G, I) codes used in partial-response maximum likelihood (PRML)-based recording systems, such as magnetic tape drives, hard disk drives and optical storage systems, provide an example. In these PRML (G, I) codes, the G and I constraints conventionally apply to runs of "0's" at the output of the modulation encoder. In general, of course, the RLL constraints can be imposed on bits of either value through simple bit-inversion of the codewords. RLL codes can also be constructed to impose further constraints. For instance, a run-length constraint may be imposed on bits of opposite value to those constrained by the G and I constraints. In PRML (G, I, M) codes, for example, the maximum run-length of "1's" at the modulation encoder output is limited to the value M. The M constraint is also known as the VFO (variable-frequency oscillator) constraint. This constraint limits runs of alternating 2T magnets . . . ++−−++−− . . . in channel input sequences (i.e., after partial-response precoding of the (G, I, M)-encoded bit-stream) to floor(M/2)+1, where T denotes the symbol duration and floor(s) denotes the largest integer not exceeding s. In recording systems such as tape drives in which a phase-locked loop acquires phase lock based on a long alternating 2T VFO pattern, the VFO constraint ensures that there is no modulation encoded sequence which can be mistaken for a long VFO pattern.

Current storage systems use high-rate modulation codes with tight global and interleave constraints. There is a constant need for improvement however. By way of example, current proprietary and LTO (Linear Tape Open)-5 tape drives use a rate-32/33 RLL code with the following modulation constraints: global constraint G=14; interleave constraint I=11; VFO constraint M=23. Aggressive estimates of potential capacity-gains in future product generations demand advances in virtually all tape technology areas. As it becomes increasingly difficult, and more costly, to improve tape media and heads, it is particularly important to seek capacity gains based on improved data format.

Efficient RLL codes exist for constraints of the type (G=2I, I, M). This type of code can be implemented using generalized Fibonacci codes or eMTR (enumerative maximum transition run) codes in both interleaves of the input data stream as described in U.S. Pat. No. 7,616,134B1. There is, for instance, an efficient rate-232/234 code for G=12, I=6, M=22. However, this code is not compatible with the DSS (data set separator) and Re-Sync (resynchronization) sequences in current LTO-5 and proprietary tape drives. These sequences correspond to particular bit patterns which are reserved for synchronization purposes and which should not therefore occur otherwise in the modulation-encoded bit-stream. In the rate-232/234 code, the G=12 constraint is too high to allow the DSS and Re-Sync patterns, which correspond to long runs of zeros at the modulation encoder output, to be excluded by the modulation encoding.

In general, improvements in RLL-encoding systems imposing global and interleave constraints would be desirable.

SUMMARY

In one embodiment, a method for producing N-bit output words of RLL-encoded data having both a global constraint $G_o$ and an interleave constraint $I_o$ on bits of a first value includes receiving N-bit input words of RLL-encoded data having both a global constraint $G_i$ and an interleave constraint $I_i$ on bits of like value; and producing the output words from respective input words by sliding-window encoding of each input word to replace predetermined bit-sequences with respective substitute sequences such that $G_o < G_i$; wherein each substitute sequence is unique and violates a run-length limit associated with the interleave constraint $I_i$ such that $I_o > I_i$.

In another embodiment, an apparatus for producing N-bit output words of RLL-encoded data having both a global constraint $G_o$ and an interleave constraint $I_o$ on bits of a first value includes a register configured to receive successive N-bit input words of RLL-encoded data having both a global constraint $G_i$ and an interleave constraint $I_i$ on bits of like value; and sliding-window encoder logic configured to produce the output words from respective input words by sliding-window encoding of each input word to replace predetermined bit-sequences with respective substitute sequences such that $G_o<G_i$; wherein each substitute sequence is unique and violates a run-length limit associated with the interleave constraint $I_i$ such that $I_o>I_i$.

BRIEF DESCRIPTION OF THE SEVERAL VIEWS OF THE DRAWINGS

Exemplary embodiments of the invention will now be described, by way of example, with reference to the accompanying drawings in which.

DETAILED DESCRIPTION

One embodiment of an aspect of the present invention provides a method for producing N-bit output words of RLL-encoded data having both a global constraint $G_o$ and an interleave constraint $I_o$ on bits of a first value. The method includes receiving N-bit input words of RLL-encoded data having both a global constraint $G_i$ and an interleave constraint $I_i$ on bits of like value; and producing the output words from respective input words by sliding-window encoding of each input word to replace predetermined bit-sequences with respective substitute sequences such that $G_o<G_i$; wherein each substitute sequence is unique and violates a run-length limit associated with the interleave constraint $I_i$ such that $I_o>I_i$.

Methods embodying embodiments of the invention may allow (G, I) codes with tight constraints to be implemented using an RLL code with constraints ($G_i$, $I_i$) as a base code and then performing sliding-window encoding of the RLL-encoded data to tighten the global constraint to $G_o<G_i$. Hence, predetermined $G_o$-violating bit-sequences are detected and replaced by $G_o$-constrained substitute sequences. This tightening of the global constraint may be achieved in the sliding window encoder by replacing the predetermined bit-sequences with unique substitute sequences all of which violate a run-length limit associated with the base interleave constraint $I_i$. This feature may allow substitute sequences to be detected at the decoder, so that the sliding-window encoding can be reversed by inverse substitutions. The tightened G constraint may thus be obtained by relaxing the I constraint to $I_o>I_i$, and the relaxed I constraint is exploited to provide uniquely-identifiable substitute sequences, permitting decoding and hence recovery of the original words of the base code. Through use of this technique, embodiments of the invention may offer substantial improvements over prior (G, I) codes, permitting significant tightening of global constraints with only modest relaxation of interleave constraints. Highly efficient (G, I) codes can be obtained in this way, and such codes can be readily designed to satisfy additional coding constraints where required. For example, long, high rate PRML codes with tight modulation constraints can be based on $G_i=2I_i$ base codes of the type discussed above, so that the resulting ($G_o$, $I_o$) code is also compatible with DSS and ReSync requirements. Efficient, high-rate PRML(G, I, M) codes may also be achieved with a global constraint that is almost as tight as the interleave constraint. Modulation encoding systems embodying the invention may thus offer valuable performance improvements in data storage systems.

The general concept of sliding-window encoding is known and involves viewing a "window", or run of bits, at a series of positions progressing through an input bit-stream, replacing particular bit sequences by substitute sequences which satisfy certain coding constraints. Embodiments of this invention perform a sliding-window-type encoding operation within the individual codewords of a base (G, I) code as described above. Unlike typical operation of prior sliding-window encoders which progress window-by-window through the input bit-stream making non-overlapping substitutions, in the encoding process of methods embodying this invention the window may slide by a fraction of the window length. The bit-runs viewed at successive window positions thus overlap, and substitutions can be performed on top of prior substitutions. This allows efficient implementation of the encoding process which can be performed in a "memoryless" fashion, i.e., without requiring knowledge, and hence storage, of encoded data immediately prior or subsequent to a given window position. In embodiments, the window slides one bit at a time, viewing a window of bits at each successive bit position of an input codeword. The size of this sliding window may vary over the length of the codeword. In particular, the window size at the left and right codeword boundaries may be different to the window size employed within the input codeword.

As indicated above, each of the unique substitute sequences used in the sliding-window encoding process violates a run-length limit associated with the interleave constraint $I_i$. The violated run-length limit here may be the run-length limit $I_i$ itself, which is applicable within codewords, or may be a run-length limit applicable at the left or right codeword boundary to preserve the $I_i$-constraint across boundaries.

While the global and interleave constraints in the input and output codewords may in general apply to "1's" or "0's", in PRML encoding systems the constraints conventionally apply to "0's". While the bits of like value in the input words are typically bits of the first value, whereby the global and interleave constraints apply to bits of the same value in the input and output words, alternative embodiments can be envisaged. This is discussed further below.

The ($G_o$, $I_o$) encoded output may also satisfy other constraints. For example, the N-bit input words of RLL-encoded data may have a global constraint $M_i$ on bits of opposite value to the like value. In this case, the substitute sequences can be adapted such that the N-bit output words of RLL-encoded data have a global constraint $M_o$ on bits of opposite value to the first value. Typically $M_o>M_i$, though this weakening of the M-constraint need only be slight and is of little consequence in practice.

Embodiments of the invention may be implemented with any desired (G, I) base code. Embodiments may employ base codes of the type $G_i=2I_i$, taking advantage of the efficiency of these codes while exploiting the relatively large difference between $G_i$ and $I_i$ for performance improvement.

An embodiment of a second aspect of the invention provides a method for decoding N-bit output words produced by a method according to embodiments of the first aspect of the invention. The method comprises sliding-window decoding each output word to replace each substitute sequence with the respective predetermined bit-sequence, thereby to recover the N-bit input word corresponding to that output word.

An embodiment of a third aspect of the invention provides apparatus for producing N-bit output words of RLL-encoded data having both a global constraint $G_o$ and an interleave constraint $I_o$ on bits of a first value. The apparatus includes a register configured to receive successive N-bit input words of RLL-encoded data having both a global constraint $G_i$ and an interleave constraint $I_i$ on bits of like value; and sliding-window encoder logic configured to produce the output words from respective input words by sliding-window encoding of each input word to replace predetermined bit-sequences with respective substitute sequences such that $G_o < G_i$; wherein each substitute sequence is unique and violates a run-length limit associated with the interleave constraint $I_i$ such that $I_o > I_i$.

An embodiment of a fourth aspect of the invention provides decoder apparatus for decoding N-bit output words produced by apparatus according to the third aspect of the invention. The decoder apparatus includes a register configured to receive successive N-bit output words; and sliding-window decoder logic for sliding-window decoding each output word to replace each substitute sequence with the respective predetermined bit-sequence, thereby to recover the N-bit input word corresponding to that output word.

An embodiment of the invention also provides a data storage system comprising encoder and decoder apparatus according to the third and fourth aspects of the invention respectively, and a recording channel comprising a recording/reproduction mechanism for recording and reproducing the RLL-encoded data on a storage medium.

In general, where features are described herein with reference to an embodiment of one aspect of the invention, corresponding features may be provided in embodiments of another aspect of the invention as appropriate.

Figure 1:
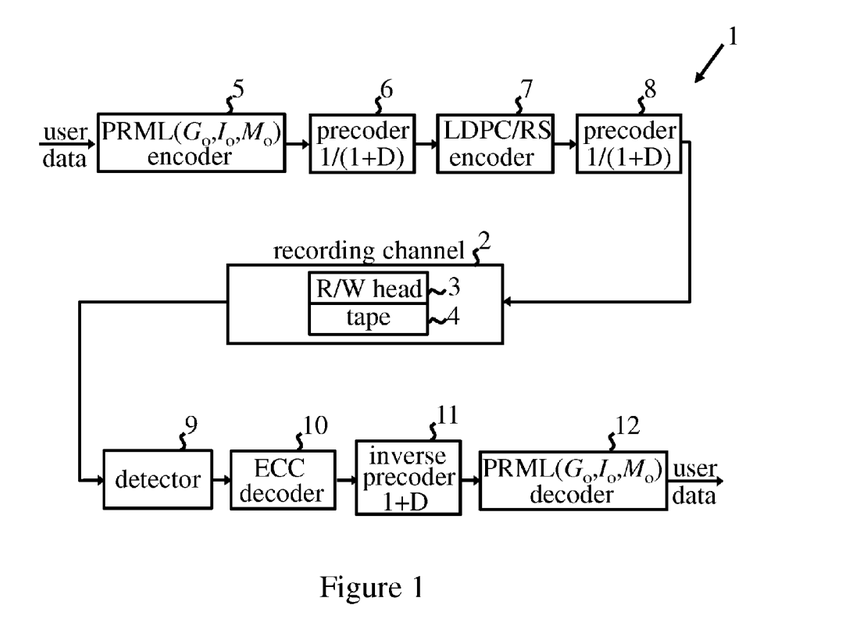
FIG. 1 is a schematic block diagram of a data storage system embodying the invention.

FIG. 1 is a schematic representation of a data storage system showing the main components involved in the recording/reproduction process. In this example, the storage system is a tape drive, indicated generally at 1, having a recoding channel 2 with a read/write head 3 for recording and reproducing data on magnetic tape 4. On the recording side, tape drive 1 includes a modulation encoder in the form of PRML $(G_o, I_o, M_o)$ encoder 5, a first partial response precoder 6, an LDPC/RS (low-density parity check/Reed-Solomon) encoder 7 and a second partial response precoder 8. On the reproduction side, drive 1 includes a detector 9, an ECC (error-correction code) decoder 10, an inverse precoder 11, and a modulation decoder in the form of PRML $(G_o, I_o, M_o)$ decoder 12.

In operation of drive 1, data to be recorded is supplied to PRML encoder 5 as a succession of K-bit data words. In PRML encoder 5, each K-bit data word is subject to a modulation-encoding process detailed below to produce an N-bit output word. The succession of N-bit output words form an RLL-encoded data stream having both a global constraint $G_o$ and an interleave constraint $I_o$ on bits of a first value. In addition, the N-bit output words have a global constraint $M_o$ on bits of opposite value to the first value. In this example, the $G_o$ and $I_o$ constraints are applied to "0's" and the $M_o$ constraint is applied to "1's". The resulting RLL-encoded data is output to precoder 6 which performs partial response precoding of the form 1/(1+D) where "+" here signifies modulo-2 addition and "D" represents a delay of one symbol period. The precoder output is supplied to encoder 7 which performs ECC coding by partial interleaving of parity symbols (in this case RS bit-pairs, or "twins") in the codeword stream from precoder 6. The (unconstrained) RS parity twins for respective codewords are generated in known manner based on the results of the parity check and inserted at desired points in the encoded bit-stream. The ECC-encoded bit-stream is output to second partial response precoder 8 which performs a second stage of 1/(1+D) precoding. The combined effect of precoders 6 and 8 is thus to implement the $1/(1+D^2)$ precoding typical of PRML systems. The output bit-stream is then recorded on tape 4 after the usual signal processing in channel 2. On reproduction, the signal obtained by reading tape 4 is supplied, after the usual reproduction signal processing, to detector 9 into which the operation of an inverse precoder of the form 1+D is incorporated. This detector is typically a soft-input/hard output detector like a Viterbi detector or a soft-input/soft output detector, which produces a likelihood measure for each recorded bit, and detects N-bit words in the reproduced signal in known manner. Parity-checking and error-correction processing is then performed in known manner in ECC decoder 10. The resulting succession of N-bit words is then processed by inverse precoder 11 and supplied to modulation decoder 12 which operates as described below to produce a succession of K-bit words corresponding to the original input data.

Figure 2:
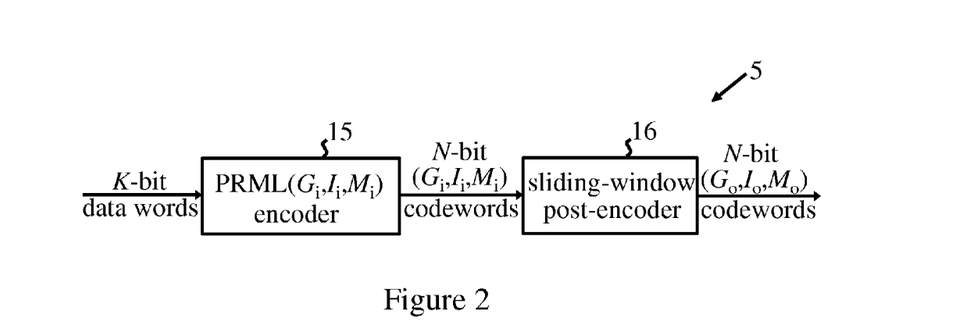
FIG. 2 is a block diagram of a modulation encoder in the FIG. 1 system.
Figure 3:
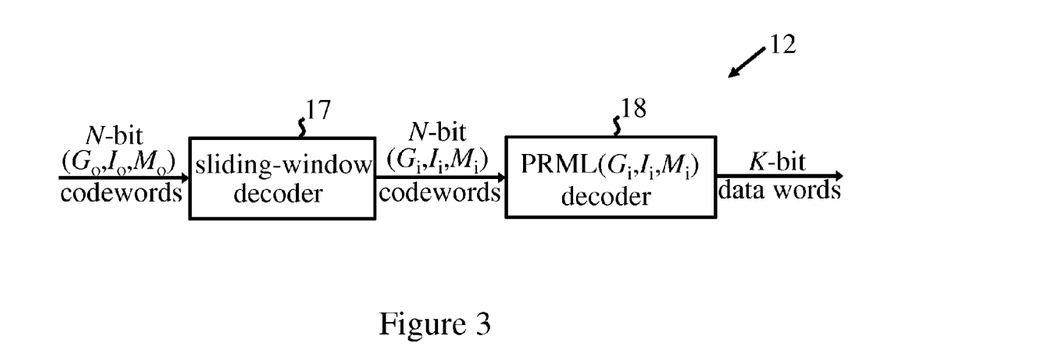
FIG. 3 is a block diagram of a modulation decoder in the FIG. 1 system.

The structure of modulation encoder 5 is shown in more detail in FIG. 2. The encoder 5 comprises an RLL encoder in the form of PRML $(G_i, I_i, M_i)$ encoder 15, and a sliding-window post-encoder 16. PRML encoder 15 implements a base RLL code to produce $(G_i, I_i, M_i)$-constrained N-bit codewords from respective K-bit data words as described further below. The resulting $(G_i, I_i, M_i)$-constrained codewords are received as the input words to sliding-window encoder 16. This operates as detailed below to produce succession of N-bit output codewords from respective N-bit input codewords. The output codewords are subject to new constraints $(G_o, I_o, M_o)$. FIG. 3 shows the corresponding modulation decoder 12. This comprises a sliding-window decoder 17 and an RLL decoder in the form of PRML $(G_i, I_i, M_i)$ decoder 18. The decoders 17, 18 perform the inverse of the encoding operations which are performed by their corresponding encoders 16, 15 and are described in detail in the following.

Figure 4:
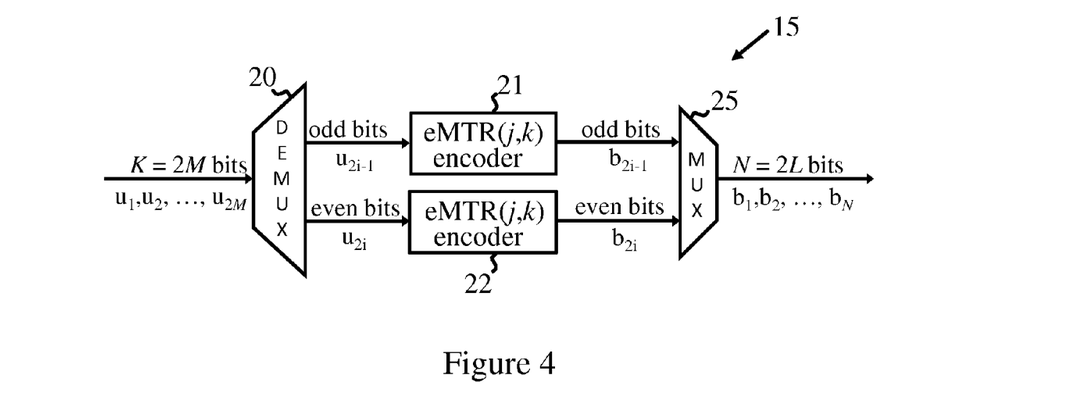
FIG. 4 illustrates structure of an RLL encoder in the modulation encoder of FIG. 2.

In this embodiment, the base $(G_i, I_i, M_i)$ code implemented in PRML encoder 15 is of the type $G_i = 2I_i$. As discussed earlier, this type of code can be efficiently implemented in known manner by separate coding of the odd and even interleaves of an input bit-stream. A typical structure for this type of encoder is illustrated in FIG. 4. Briefly, input data words of even length K=2M are separated into odd and even interleave bit-streams by demultiplexer (DEMUX) 20. The odd bits $u_{2i-1}$, i=1 to M, of each input word are subject to binary enumerative maximum-transition-run (eMTR) encoding, with run-length constraints (j, k), in eMTR encoder 21. This encoding is performed in known manner to produce an RLL-encoded output sequence $b_{2i-1}$, i=1 to L, with a constraint j on the maximum run-length of "1's" and a constraint k on the maximum run-length of "0's". The even bits $u_{2i}$ of each input word are also subject to eMTR encoding, with the same constraints (j, k), in eMTR encoder 22. This similarly produces an encoded L-bit sequence $b_{2i}$ in the even interleave with the constraint j on runs of "1's" and constraint k on runs of "0's". The encoded interleave sequences $b_{2i-1}$ and $b_{2i}$ are then re-interleaved by multiplexer (MUX) 25 to produce a (2L=N)-bit output codeword $(b_1, b_2, \ldots, b_N)$. The succession of N-bit codewords output by encoder 15 is an RLL-encoded bit-stream subject to the constraints $(G_i, I_i, M_i)$, with $G_i = 2k$, $I_i = k$, and $M_i = 2j$, where $G_i$ is a global constraint on runs of "0's", $I_i$ is an interleave constraint on runs of "0's", and $M_i$ is a global constraint on runs of "1's" corresponding to the VFO constraint discussed above.

Figure 5:
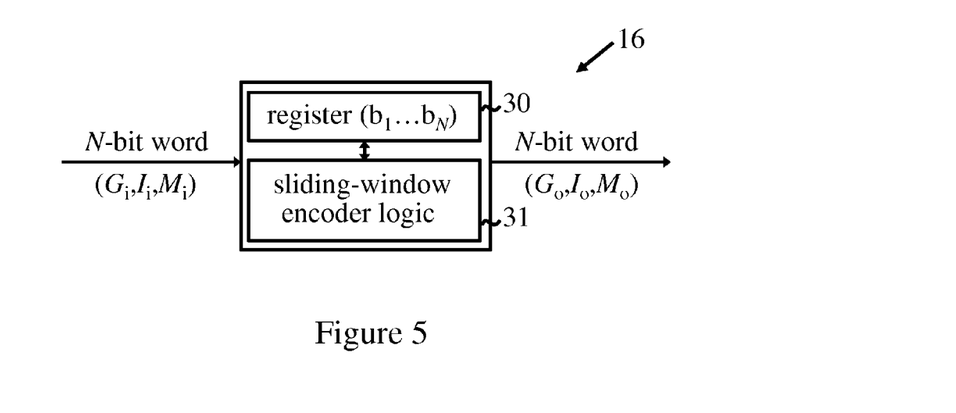
FIG. 5 is a more detailed illustration of a sliding-window encoder in the modulation encoder.
Figure 6:
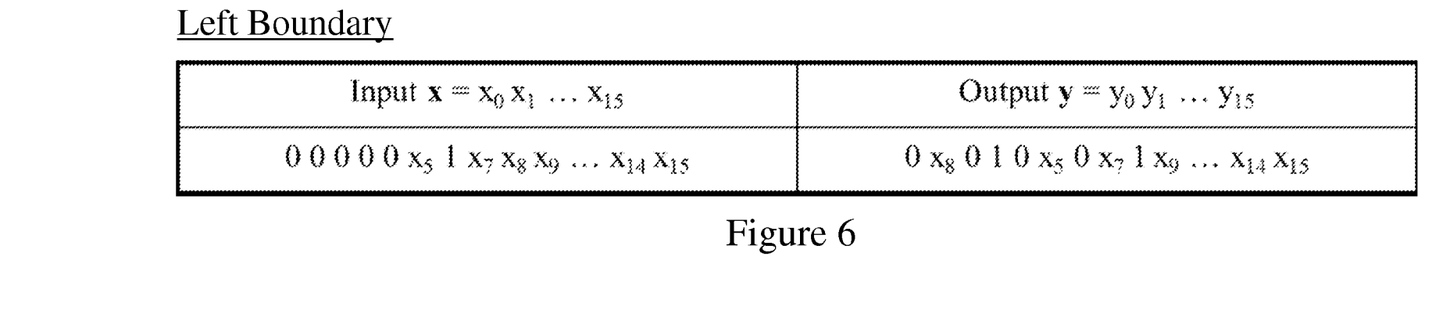
FIGS. 6, 7, 8A and 8B are tables indicating substitutions performed during sliding-window encoding in an exemplary implementation of the modulation encoder.

The ($G_i$, $I_i$, $M_i$)-constrained N-bit codewords from RLL encoder 15 form the input words to the sliding-window encoder which is illustrated in more detail in FIG. 5. The sliding-window encoder 16 is represented schematically here as comprising a register 30 for storing the bits $b_1, b_2, \ldots, b_N$ of an N-bit input word from RLL encoder 15, and logic 31 for performing the sliding-window encoding operation to be described. The functionality of sliding-window encoder logic 31 may be implemented in general in hardware or software or a combination of hardware and software components, though implementation in hard-wired logic provides for simplicity and speed of operation. Suitable implementations will be readily apparent to those skilled in the art from the description herein.

In operation of the sliding-window encoder, an N-bit input word received from RLL encoder 15 is stored in register 30. The encoder logic 31 scans each input word from left to right viewing a predetermined window of bits at successive positions along the bit sequence $b_1$ to $b_N$. The window slides by a fraction of the window length between each of these positions. In this embodiment, the window slides one bit at a time, whereby a window of bits is viewed at successive bit-positions $b_1$, $b_2$, etc., progressing bit-by-bit across the codeword. At each bit position, the encoder logic 31 compares the bit-sequence in the window with a set of predetermined bit-sequences. These predetermined bit-sequences contain bit-patterns which violate a run-length limit associated with the global constraint $G_o$, where $G_o < G_i$. If the bit-sequence in the window matches one of these $G_o$-violating bit-sequences, then encoder logic 31 replaces that bit sequence in the input word with a respective substitute bit-sequence which satisfies the $G_o$-constraint. The sliding-window violation-detection and substitution operation continues until the window reaches the right codeword boundary, whereupon the original input word has been encoded into a $G_o$-constrained output word.

The mapping between $G_o$-violating bit-sequences and $G_o$-constrained substitute sequences in the above operation is predefined in the encoder logic, for example in a lookup table. Each of the substitute sequences contains a bit pattern which violates a run-length limit associated with the interleave constraint $I_i$. The effect of the sliding-window encoding process is therefore to tighten the global constraint from $G_i$ to $G_o$ while relaxing the interleave constraint to a value $I_o > I_i$. This violation of the $I_i$-constraint is exploited to permit detection of substitute sequences in the decoder 17. Each substitute sequence is also unique, allowing the appropriate inverse substitution to be made on decoding to restore the original $G_o$-violating bit-sequence.

A particular example of the sliding-window encoder operation will now be described for use with an RLL encoder 15 implementing an even-length (N=2L)
PRML($G_i$=12, $I_i$=6, $M_i$=22) base code with the following tighter global and interleave run-length limits at the left and right codeword boundaries:

$G_{left} = 6 = G_{right}$;
$I_{left} = 3 = I_{right}$;
$M_{left} = 10$, $M_{right} = 12$.

From the N-bit codewords of this base PRML code, the sliding-window post-encoder 16 produces output N-bit codewords of a PRML($G_o$=8, $I_o$=7, $M_o$=24) code with the following tighter run-length limits at codeword boundaries:

$G_{left} = 4 = G_{right}$;
$I_{left,odd} = 3 = I_{right,even}$;
$I_{left,even} = 4 = I_{right,odd}$;
$M_{left} = 11$, $M_{right} = 13$;

where, for instance, $I_{right,even}$ specifies the run-length limit for the even interleave at the right codeword boundary, and so on. The sliding-window encoder 16 uses a 16-bit sliding window, subject to a smaller window size at the right codeword boundary as explained later. The encoder logic 31 thus inputs the bit-sequence in a 16-bit window $x = x_0, x_1, \ldots, x_{15}$ which slides bit-by-bit across the input codeword $b_1, b_2, \ldots, b_N$. At each window position, the encoder compares the 16-bit input sequence with a set of predetermined bit-sequences defined in the substitution tables below. If a match is detected, encoder logic 31 replaces the input bit-sequence in the codeword with an output bit sequence $y = y_0, y_1, \ldots, y_{15}$ as specified in the substitution tables. Hence, operation commences with an input bit-sequence $x = b_1, b_2, \ldots, b_{16}$. If no substitution is made then the next input sequence will be $x = b_2, b_3, \ldots, b_{17}$. If, however, a substitution is made at the first window position, the next input sequence will be $x = y_1, y_2, \ldots, y_{15}, b_{17}$, and so on. Substitutions can thus be made on top of previous substitutions as the window progresses across the input codeword.

The mapping between predetermined, $G_o$-violating bit-sequences and their corresponding $G_o$-constrained substitute sequences in the foregoing process is defined in the tables of FIGS. 6, 7, 8A and 8B. At commencement of operation, with the encoder window at the left codeword boundary, the encoder logic 31 checks the input sequence $x = x_0, x_1, \ldots, x_{15} = b_1, b_2, \ldots, b_{16}$ against the left boundary substitution table shown in FIG. 6. In particular, the encoder checks if the input bit-sequence matches the predetermined bit-sequence in the left column of the table. The bits $x_5, x_7, x_8, x_9, \ldots x_{14}$ and $x_{15}$ in this sequence are simply the corresponding bits of the input sequence and may thus take either bit-value. If there is no match, no substitution is made and the sliding window moves on to the next bit position. If a match is detected, the input bit sequence x is replaced in register 30 by the substitute sequence $y = y_0, y_1, \ldots, y_{15}$ shown in the right column of the substitution table. Here, again, bits $x_5, x_7, x_8, x_9, \ldots x_{14}$ and $x_{15}$ in this substitute sequence are the corresponding bits of the input sequence. This substitution at the left codeword boundary enforces $G_{left} = 4$ in the output codeword whenever $G_{left} > 4$ in the input codeword. Note that $x_6 = 1$ always holds because $I_{left} = 3$ in the input word. Only the nine initial bits are remapped and the last seven bits pass unchanged. Note also that the even interleave of y starts with four zeros which is a violation of $I_{left} = 3$ in the input word. This allows detection of this substitution during decoding. The substitution can also be reversed by the modulation decoder 12 because the substitution map is one-to-one. The $I_i$ and $G_i$ constraints of the original codeword towards the right of position $x_5$ are maintained because the odd interleave is unchanged and, in the even interleave, $x_8$ has been replaced by a "1". The M constraint towards the right is at most weakened by 1 due to replacement of $x_8$ by "1".

The encoder window then slides to the right through successive bit-positions within the codeword. In each of these positions, encoder logic 31 checks the input sequence $x = x_0, x_1, \ldots, x_{15}$ against the predetermined bit-sequences shown in the substitution table of FIG. 7, making the corresponding substitution $y = y_0, y_1, \ldots, y_{15}$ in the codeword in register 30 if a match is detected. These substitutions are applied to enforce $G_o = 8$ whenever $G_i > 8$. The substitutions address three cases depending on the number of consecutive leading zeros (assuming the bit $b_{k-1}$ which is immediately to the left of the length-16 sliding window equals "1").

Case 1

Figure 7:
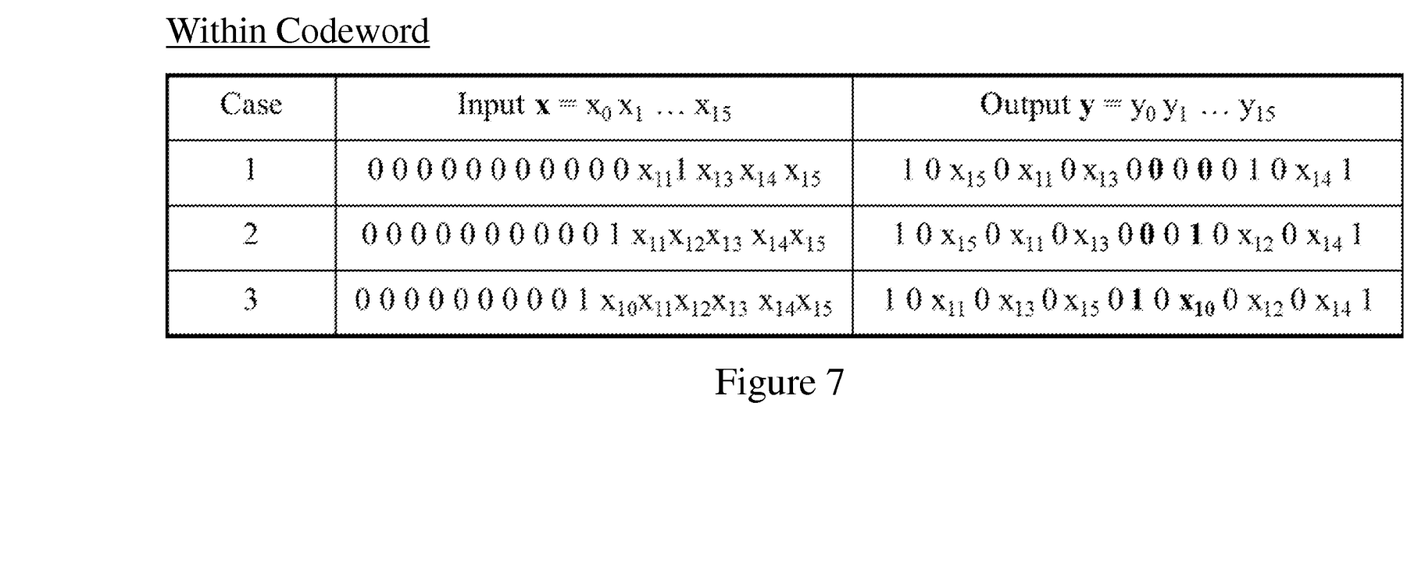

This case addresses input sequences with 11 or 12 leading "0"s". In this case, component $b_{k-2}$ must be "1" because of the $I_i=6$ constraint. Note that $I_i=6$ implies that $x_{12}=$"1" and either $x_{11}$ or $x_{13}$ must be "1". Thus, in the substitute sequence y there can be at most 7 consecutive zeros. As the component $b_{k-1}$ to the left of x equals "1", the substitution string y satisfies an $I_o=7$ constraint.

Case 2

This case addresses input sequences with 10 leading zeros. Because $I_i=6$, either $x_{11}$ or $x_{13}$ must be "1". Thus, in the substitute sequence y there can be at most 5 consecutive zeros. As $b_{k-1}=$"1", the substitution string y satisfies an $I_o=7$ constraint.

Case 3

This case addresses input sequences with 9 leading zeros. Because $I_i=6$, either $x_{10}$ or $x_{12}$ must be "1". In the substitute sequence y, therefore, there can be at most 7 consecutive zeros.

In all three cases above, the substitute sequence $y=y_0 y_1 \ldots y_{15}$ has an interleave constraint of $I_o=7$. This allows detection of the substitutions during decoding. In addition, the components $y_8$ and $y_{10}$ marked in bold-type in the table have different pairs of values. This makes the substitute sequences unique, permitting the correct inverse substitution to be made on decoding. The I and G constraints towards the left and right of the substitute sequence remain unchanged. At the left side, this is apparent because the first two bits are $(x_0, x_1)=(0, 0)$. At the right side, the G constraint is not increased because the last bit of the substituted string is "1". Furthermore, case-by-case checking shows that the I constraint at the right side is also maintained. In particular, the $I_i$ constraint $I_{right}=3$ at the right boundary is preserved. The M constraint towards the left and right of the substitute sequence y is at most weakened by one because of the "1" at the first and last positions in y.

After completing the sliding-window operation within the input codeword, the length-16 sliding window has reached the right codeword boundary. At this stage, the 16-bit window terminating with the last bit in register 30 satisfies the $I_i$ and $G_i$ constraints of the base code towards the right. In particular, the tightened $I_{right}=3$ constraint holds at the right boundary. Furthermore, the substitutions up to this point ensure that $G_o=8$ holds towards the left including the first nine bits of the 16-bit window. It remains to check the last 15 components of this window for violations of $G_o=8$ and to enforce the boundary run-length limit $G_{right}=4$ for the output codeword. To do this, encoder logic 31 inputs the bits $x=x_0 \ldots x_{14}$ in a 15-bit window at the end of the N-bit sequence in register 30. Hence, if no substitutions have occurred in the last few steps of the sliding-window operation, then $x=b_{N-14}, b_{N-13}, \ldots, b_N$ being the last 15 bits of the original input codeword. In any case, the length-15 input sequence x satisfies the $G_i$ and $I_i$ constraints of the base code towards the right. Furthermore, when restricted to consideration of $G_o=8$ violations, we can assume that the bit in register 30 immediately to the left side of the length-15 input sequence is "1".

Figure 8:
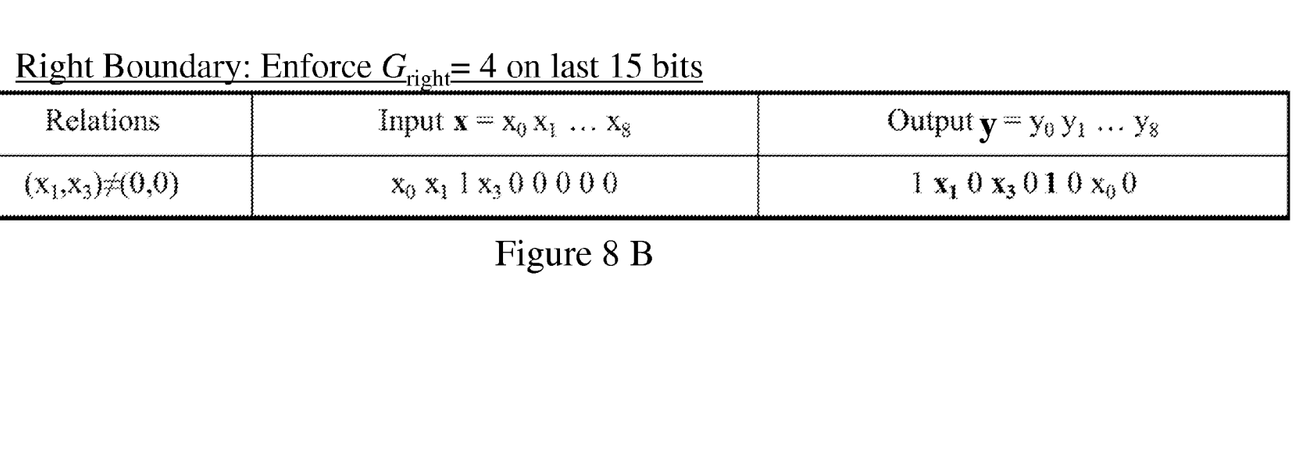
Figure 8A:
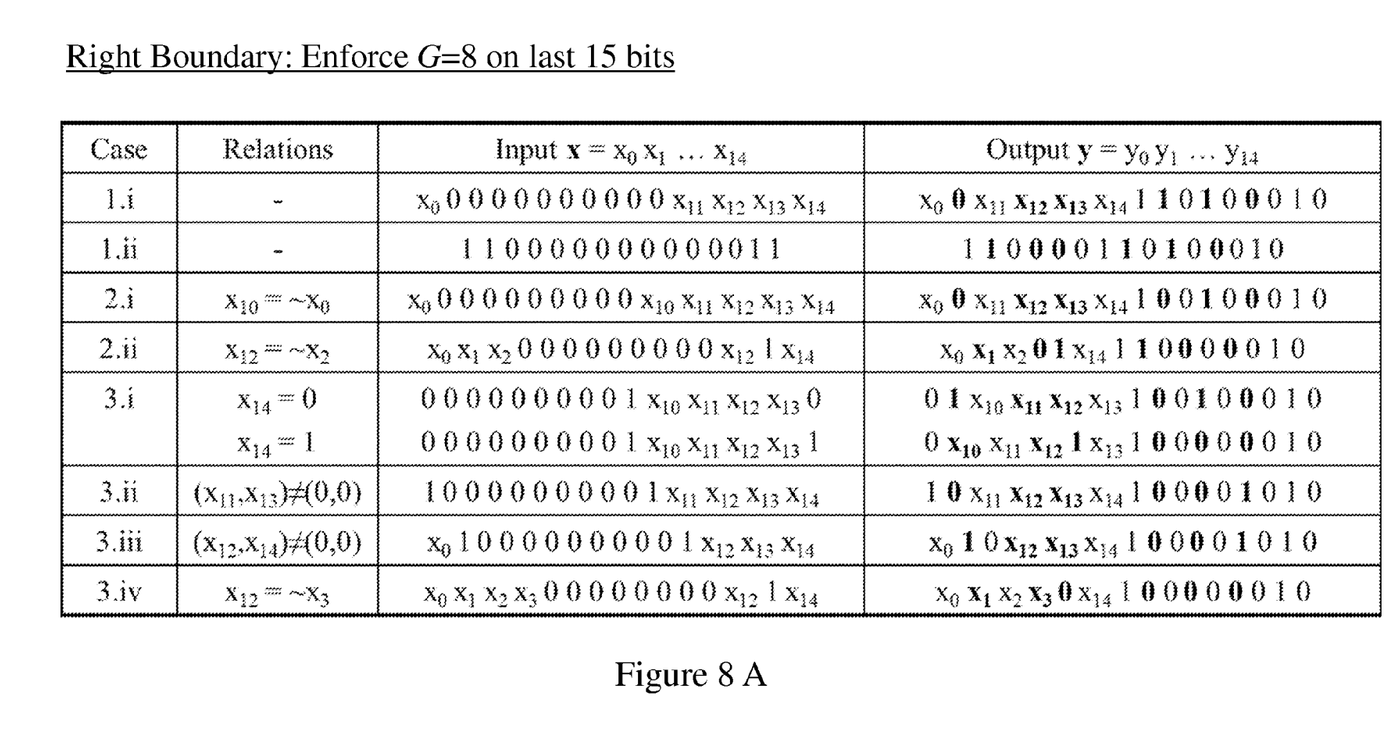

The encoder logic 31 checks the 15-bit input sequence x for violations of $G_o=8$ using the substitution table of FIG. 8A. As before, if the input sequence x matches any of the predetermined sequences x shown in the table, the 15-bit sequence is replaced in register 30 by the substitute sequence y shown. The table addresses three cases, depending on the run-length of consecutive "0"s" in x. These cases are further subdivided depending on the position of the first zero of the zero-run.

Case 1

This case addresses input sequences with a run of 11 or 12 consecutive zeros. Sub-case 1.i corresponds to this run being shifted by shift 0 or 1 from the start of the input sequence. Sub-case 1.ii corresponds to this run being shifted by 2 from the start of the input sequence.

Case 2

This case addresses input sequences with a run of 10 consecutive zeros. Sub-case 2.i corresponds to a shift of 0 or 1 from the start of the input sequence. In this case, the relation $x_{10}=\sim x_0$, (where $\sim$ denotes bit inversion) applies so that $x_{10}$ can be omitted from the substitute sequence while ensuring that the correct inverse substitution is still well-defined for decoding purposes. Sub-case 2.ii corresponds to a shift of 2 or 3 from the start of the input sequence with relation $x_{12}=\sim x_2$. Bit $x_{12}$ can thus be omitted from the substitute sequence and the inverse substitution is still well-defined.

Case 3

This case addresses input sequences with a run of 9 consecutive zeros. Sub-case 3.i corresponds to a shift of 0 from the start of the input sequence, with $x_{14}=0$ and $x_{14}=1$ being treated separately. Sub-case 3.ii corresponds to a shift of 1 with relation $(x_{11}, x_{13}) \neq (0, 0)$. Sub-case 3.iii corresponds to a shift of 2 with relation $(x_{12}, x_{14}) \neq (0, 0)$. Sub-case 3.iv corresponds to a shift of 3 or 4 with relation $x_{12}=\sim x_3$.

The substitutions of FIG. 8A satisfy a run-length limit $I_{right,odd}=4$ on zero-runs in the odd interleave at the right boundary of the output codeword due to the pattern 1 0 0 0 0 at the end of this interleave in the substitute sequences y. This permits detection of the substitutions on decoding. Moreover, the substitute patterns $y=y_0 y_1 \ldots y_{14}$ are selected to have a unique characteristic subsequence $y_1 y_3 y_4 y_7 y_9 y_{11}$ as highlighted in bold in the table. This property is used to identify the correct inverse substitution on decoding. In all three cases and sub-cases, the I and G constraints towards the left are maintained because any potential non-zero initial part $x_0 x_1 x_2 x_3$ of the window is substituted by either the same sub-string or a sub-string with "1"s" at certain dedicated locations. Furthermore, the M constraint towards the left remains unchanged in all cases except for case 2i, shift=1, where $x_0$ is substituted by "1" and, therefore, the M constraint is weakened by 1. Since the M constraint can be weakened towards the right and towards the left of a substitution by 1, it follows that the transformed sequence satisfies an M constraint $M_o$ that is greater by 2 than the M constraint $M_i$ before the substitutions.

Violations of $G_{right}=4$ at the right boundary are eliminated by encoder logic using the substitution table of FIG. 8B. For this the encoder logic uses a length-9 window with input $x=x_0 \ldots x_7 x_8$ to check the 9 rightmost bits in register 30. Hence, if no substitutions have occurred in the last few steps, then $x=b_{N-8} \ldots b_{N-1}, b_N$. Recall that, due to the base code constraints, x satisfies $I_{right}=3$. The substitution of FIG. 8B then enforces a G=4 constraint at the right boundary. The resulting sequence satisfies the run-length limits $I_{right,odd}=4$ and $I_{right,even}=3$ on zero-runs in the interleaves at the right boundary.

Moreover, the relation $(x_1, x_3) \neq (0, 0)$ applies to the substitution and the I constraint on the left of y is maintained as is the G constraint on the left. The M constraint toward the left is weakened by 1 because $x_0$ is substituted by "1". The three bits $(x_1, x_3, 1)$ highlighted in bold in the substitute sequence are also unique compared to the corresponding bits $(y_7, y_9, y_{11})$ in the substitutions of FIG. 8A.

The order in which the three different types of substitutions, i.e., left-boundary substitutions, substitutions within codewords, and right-boundary substitutions, are carried out in this embodiment is important. In general, one obtains different resulting sequences depending on whether one first applies substitutions within a codeword and, in a second step, does the left-boundary substitution, or vice versa. The encoding schedule is therefore important here. One way to proceed is as above, i.e., starting with substitutions at the left codeword boundary and then moving from left to right applying substitutions within the codeword. As the three cases 1 to 3 in the table of FIG. 7 are mutually exclusive, the order of checking these three cases does not matter. Finally, the right-boundary substitutions are applied as necessary. Note that the two substitution tables of FIGS. 8A and 8B for the right codeword boundary are mutually exclusive because in FIG. 8A the last five bits cannot all be zero. Therefore, it does not matter in which order these tables are used at the right boundary.

As a result of the above process, sliding-window encoder 16 outputs N-bit output codewords of a PRML($G_o$=8, $I_o$=7, $M_o$=24) code satisfying the boundary constraints specified earlier. The $G_i$=12 constraint of the PRML base code is thus tightened significantly to $G_o$=8 at the expense of increasing the interleave constraint by only one from $I_i$=6 to $I_o$=7. The VFO constraint is increased by only two from $M_i$=22 to $M_o$=24. Moreover, the relaxation of the interleave constraint is exploited to permit identification of substitutions, and hence inversion of the sliding-window encoding in modulation decoder 12. As detailed above, all substitute sequences violate a run-length limit associated with the interleave constraint $I_i$. Specifically, left boundary substitutions have $I_{left, even}$=4, violating the $I_{left}$=3 limit associated with the constraint $I_i$; substitutions within codewords have I=7, violating the $I_i$=6 constraint; and right boundary substitutions have $I_{right,odd}$=4, violating the $I_{right}$=3 limit associated with constraint $I_i$. All substitute sequences are also unique, due to the one-to one mapping of FIG. 6 and the unique bit-patterns highlighted in bold in FIGS. 7, 8A and 8B. There is therefore a unique inverse mapping of substitute sequences back to their corresponding original bit-sequences.

In operation of modulation decoder 12 of FIG. 3, the reproduced N-bit ($G_o$=8, $I_o$=7, $M_o$=24) codewords are supplied in succession to sliding-window decoder 17. This decoder comprises an N-bit register and decoder logic, not shown specifically in the figure, implementing inverse functionality to sliding-window encoder 16. During decoding, all the inverse substitutions need to be carried out in the reverse order to the (forward) substitutions made during encoding. Hence, the sliding-window decoding operation starts at the right codeword boundary, and the window then moves bit-by-bit to the left within the codeword, until finally the left codeword boundary is reached. In each phase, the decoder logic detects substitutions by checking for violations of the appropriate run-length limit associated with the constraint $I_i$ as detailed above. If a violation, and hence substitution, is detected, the appropriate inverse substitution is identified in the substitution tables using the unique bit-pattern contained in the substitute sequence as explained above. In this way, the decoder logic can decode each N-bit word, replacing each substitute sequence with its respective original bit-sequence, thereby to recover the original N-bit ($G_i$, $I_i$, $M_i$) codeword of the base code. The resulting ($G_i$, $I_i$, $M_i$) codeword is output to PRML decoder 18 which inverts the operation of base PRML encoder 15 to recover the original K-bit data word corresponding to that codeword.

It will be seen that the above system provides for highly efficient implementation of a (G, I, M) code with tight modulation constraints. While the above implementation with a G=2I base code can be applied to any even-length code, a particularly efficient rate 232/234 code can be implemented in this way. The resulting constraints ($G_o$=8, $I_o$=7, $M_o$=24), or ($G_o$=10, $I_o$=8, $M_o$=26) after parity-twins insertion in encoder 7, enable such a code to provide a much-needed performance improvement over the rate 32/33 (G=14, I=11, M=23) used in current proprietary and LTO tape drives discussed earlier. In particular, a 2.2% gain in capacity can be achieved compared to operation with the prior code. The tight $G_o$-constraint of the code means that the DSS and ReSync sequences used in current tape drives are necessarily excluded, as is required, at the output of modulation encoder 5 of system 1. In particular, the code excludes DSS patterns of length 24 or more. The ReSync pattern 1.00000000.01000000.00001000.00000001 is excluded because there cannot be two consecutive runs of eleven "1's" or "0's" in the channel data (after precoding). The tighter $G_o$=10 (with parity twins) constraint is also expected to improve timing performance during read-back, and this is critical for operation at high linear densities. This benefit is in addition to the 2.2% gain in format efficiency. The VFO constraint $M_o$=26 (with parity-twins) is only slightly weaker than the M=23 constraint of the prior code. This VFO constraint is not critical in that the weakening has no negative effect on readback performance.

The sliding-window post-encoding technique described above thus enables construction of efficient PRML(G, I, M) codes with a global constraint G that is almost as tight as the interleave constraint I. In general, the tightness of the global constraint will depend on the base PRML-code. In particular, if the base PRML-code has an interleave constraint I' and global constraint G'=2I', the constraints for the new code can be selected as follows: I≥I'+1 for the interleave constraint; M=M'+2; and G can be chosen such that the capacity of the (G, I, M) constraint exceeds the capacity of the (G', I', M') constraint. Moreover, the improved codes are efficiently implemented in the modulation encoding/decoding system with a simple, memoryless sliding-window encoder/decoder.

Figure 9:
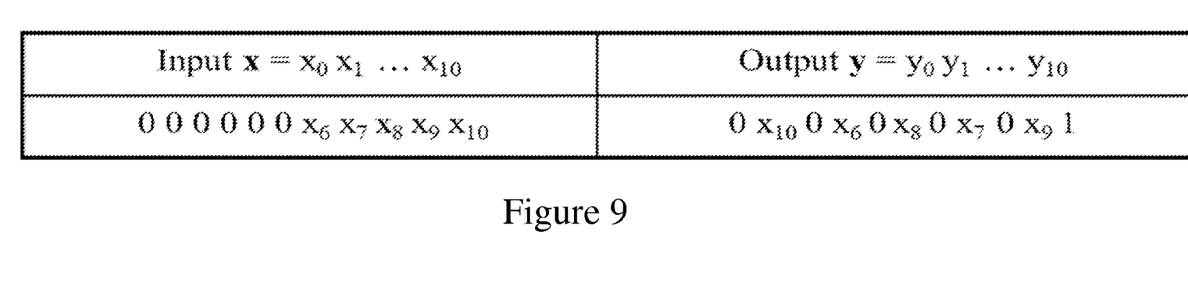
FIG. 9 indicates a substitution performed during sliding-window encoding in another implementation of the modulation encoder.

It will of course be appreciated that the sliding-window post-encoding technique can be applied to tighten the G-constraint of a wide variety of (G, I) base codes. As another example, FIG. 9 indicates a substitution which can be applied during sliding-window post-encoding in another implementation of modulation encoder 5. This implementation uses a base code with I'=4, G'=2I'=8, M'=∞. Using the substitution of FIG. 9 within codewords, the left-to-right sliding-window post-encoder transforms the (G'=8, I'=4) constraint into a (G=5, I=6)-constraint (note that the symbol to the left $x_{-1}$ always equals 1). Thus, for these parameters, one can even achieve G<I. The substitutions at left and right codeword boundaries are not given as these will depend on the specific code implementation and can be designed as appropriate for a given code. The sliding-window post-encoding technique can of course be applied with other implementations of RLL encoder 15 and is not limited to application with even-length codes.

Many other changes and modifications can be made to the exemplary embodiments described above. Some examples are given below.

It will usually be the case that, as in the above embodiment, the global and interleave constraints in the input and output words of the sliding-window encoder apply to bits of the same value. Embodiments can be envisaged, however, in which these constraints apply to bits of one value in the input words and bits of the opposite value in the output words. Such a scenario can be envisaged, for example, if the base encoder 15 in the above embodiment produced a bit-inversion of the base code described, so that the resulting (G, I, M) codewords were bit-inverted. In such cases, appropriate bit-inversion functionality can be included in the sliding-window encoder. Bit inversion could be performed, for example, before the sliding-window encoding operation described. Alternatively, the bit inversion could be incorporated into the sliding-window encoding operation. Input sequences which do not correspond to violations of the required global constraint could then simply be replaced by their corresponding bit-inverted sequences in this process. The predetermined constraint-violating sequences would be replaced as described by their unique substitute sequences which in this case account for the bit-inversion.

Embodiments of the sliding-window encoder can be envisaged in which the sliding window slides by more than one bit at a time. Also, the sliding-window encoding operation described above could proceed from right to left across codewords in an alternative embodiment. In such a scheme all the substitution maps need to operate on flipped vectors, i.e., the bit-order of substitute sequence y in the substitution tables of FIGS. 6, 7, 8A and 8B would be reversed. Also, the left-boundary substitution would be carried out first at the right-hand end of the codeword. The length-16 sliding window encoder would then apply the flipped substitutions within a codeword and, finally, the flipped right-boundary substitutions would be applied at the left-hand end of the codeword. The decoder would then implement the inverse of this process.

While application in a tape drive has been described by way of example, embodiments of the invention can of course be applied in other data storage systems, for instance hard disk drives and optical storage systems.

It will be appreciated that many other changes and modifications can be made to the exemplary embodiments described without departing from the scope of the invention.

The invention claimed is:

1. A method for producing N-bit output words of RLL-encoded data having both a global constraint $G_o$ and an interleave constraint $I_o$ on bits of a first value, the method comprising:
  receiving N-bit input words of RLL-encoded data having both a global constraint $G_i$ and an interleave constraint $I_i$ on bits of like value; and
  producing the output words from respective input words by sliding-window encoding of each input word to replace predetermined bit-sequences with respective substitute sequences such that $G_o<G_i$;
  wherein each substitute sequence is unique and violates a run-length limit associated with the interleave constraint $I_i$ such that $I_o>I_i$.

2. The method of claim 1, wherein the first value is "0".

3. The method of claim 1, wherein the bits of like value are bits of the first value.

4. The method of claim 1, wherein, in the sliding-window encoding, the window slides by a fraction of the window length.

5. The method of claim 4, wherein the window slides one bit at a time.

6. The method of claim 1, wherein $G_i=2 I_i$.

7. The method of claim 1, wherein:
  the N-bit input words of RLL-encoded data have a global constraint $M_i$ on bits of opposite value to the like value; and
  the substitute sequences are adapted such that the N-bit output words of RLL-encoded data have a global constraint $M_o$ on bits of opposite value to the first value.

8. The method of claim 7, wherein $M_o>M_i$.

9. The method of claim 8, wherein $M=M'+2$.

10. The method of claim 9, wherein $G_i=12$, $I_i=6$, and $M_i=22$, and $G_o=8$, $I_o=7$, and $M_o=24$.

11. The method of claim 1, further comprising producing the N-bit input words by RLL-encoding K-bit data words.

12. A method for decoding N-bit output words produced by the method of claim 1, the method comprising sliding-window decoding each output word to replace each substitute sequence with the respective predetermined bit-sequence, thereby to recover the N-bit input word corresponding to that output word.

13. The method of claim 12, further comprising RLL-decoding the N-bit input words into K-bit data words.

14. An apparatus for producing N-bit output words of RLL-encoded data having both a global constraint $G_o$ and an interleave constraint $I_o$ on bits of a first value, the apparatus comprising:
  a register configured to receive successive N-bit input words of RLL-encoded data having both a global constraint $G_i$ and an interleave constraint $I_i$ on bits of like value; and
  sliding-window encoder logic configured to produce the output words from respective input words by sliding-window encoding of each input word to replace predetermined bit-sequences with respective substitute sequences such that $G_o<G_i$;
  wherein each substitute sequence is unique and violates a run-length limit associated with the interleave constraint $I_i$ such that $I_o>I_i$.

15. The apparatus of claim 14, wherein the sliding-window encoder logic is adapted such that the window slides by a fraction of the window length.

16. The apparatus of claim 14, wherein the sliding-window encoder logic is adapted such that the window slides one bit at a time.

17. The apparatus of claim 14, wherein the N-bit input words of RLL-encoded data have a global constraint $M_i$ on bits of opposite value to the like value, and wherein the substitute sequences are adapted such that the N-bit output words of RLL-encoded data have a global constraint $M_o$ on bits of opposite value to the first value.

18. The apparatus of claim 14, wherein the bits of like value are bits of the first value.

* * * * *